(12) United States Patent
Zhu

(10) Patent No.: US 7,482,615 B2
(45) Date of Patent: Jan. 27, 2009

(54) HIGH PERFORMANCE MOSFET COMPRISING STRESSED PHASE CHANGE MATERIAL

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 11/161,062

(22) Filed: Jul. 21, 2005

(65) Prior Publication Data

US 2007/0018202 A1 Jan. 25, 2007

(51) Int. Cl.
H01L 29/12 (2006.01)
(52) U.S. Cl. .................. 257/1; 257/E29.299; 257/368; 438/257
(58) Field of Classification Search .............. 257/2, 257/314, 315, 1
See application file for complete search history.

(56) References Cited

U.S. PATENT DOCUMENTS

| 6,903,361 | B2 * | 6/2005 | Gilton | 257/2 |
|---|---|---|---|---|
| 2002/0145446 | A1 * | 10/2002 | Aitouarab | 326/68 |
| 2004/0262635 | A1 * | 12/2004 | Lee | 257/199 |
| 2006/0270180 | A1 * | 11/2006 | Lee et al. | 438/409 |
| 2007/0014144 | A1 * | 1/2007 | Wicker | 365/148 |
| 2007/0025410 | A1 * | 2/2007 | Agarwal et al. | 372/94 |

OTHER PUBLICATIONS

Matthias Wuttig, "Towards A Universal Memory?" *Nature Materials*, vol. 4, p. 265-266 (2005).
L. Van Pieterson et al., "Phase-Change Recording Materials With a Growth-Dominated Crystallization Mechanism: A Materials Overview" *Journal of Applied Physics*, vol. 97, 083520 (2005).
Heon Lee et al., "Indium Selenide (In2Se3) Thin Film For Phase-Change Memory" *Materials Science & Engineering B*, vol. 119 p. 196-201 (2005).

* cited by examiner

*Primary Examiner*—Kenneth A Parker
*Assistant Examiner*—Paul A Budd
(74) *Attorney, Agent, or Firm*—Scully, Scott, Murphy & Presser, P.C.; H. Daniel Schnurmann

(57) ABSTRACT

The present invention relates to semiconductor devices that each comprises at least one field effect transistor (FET) containing an intrinsically stressed phase change material layer. The intrinsically stressed phase change material layer is arranged and constructed for creating stress in the channel region of the FET. Preferably, the intrinsically stressed phase change material layer is deposited over the channel region of the FET. For an n-channel FET, the intrinsically stressed phase change material layer preferably contains intrinsic compressive stress that is created by phase change, for example, from a polycrystalline phase to an amorphous phase. Alternatively, for a p-channel FET, the intrinsically stressed phase change material layer preferably contains intrinsic tensile stress that is created by phase change, for example, from an amorphous phase to a polycrystalline phase.

8 Claims, 4 Drawing Sheets

HIGH PERFORMANCE MOSFET COMPRISING STRESSED PHASE CHANGE MATERIAL

FIELD OF THE INVENTION

This invention relates to a semiconductor device containing at least one high performance field effect transistor (FET), and more specifically to a high performance metal-oxide-semiconductor field effect transistor (MOSFET) containing a stressed phase change material. The present invention also relates to methods for fabricating such a semiconductor device.

BACKGROUND OF THE INVENTION

Mechanical stresses within a semiconductor device substrate can be used to modulate device performance. For example, in silicon, hole mobility is enhanced when the silicon film is under compressive stress, while the electron mobility is enhanced when the silicon film is under tensile stress. Therefore, compressive and/or tensile stresses can be advantageously created in the channel regions of p-channel MOSFETs and/or n-channel MOSFETs, in order to enhance the performance of such p-channel and/or n-channel MOSFETs.

One conventional approach for creating a stressed silicon channel region is to form such a channel region upon a stress-inducing buffer layer. For example, a tensilely stressed silicon channel layer can be formed by epitaxially growing silicon over a thick, relaxed SiGe buffer layer. The lattice constant of germanium is about 4.2% greater than that of silicon, and the lattice constant of a silicon-germanium (SiGe) alloy is linear with respect to its germanium concentration. As a result, the lattice constant of a SiGe alloy with twenty atomic percent of germanium is about 0.8% greater than the lattice constant of silicon. Epitaxial growth of silicon on such a SiGe buffer layer will yield a silicon channel layer under tensile stress, with the underlying SiGe buffer layer is essentially unstrained, or "relaxed."

Another conventional approach for creating compressive and/or tensile stresses in the channel regions of the p-MOSFET and/or n-MOSFET devices is to cover the devices with compressively and/or tensilely stressed silicon nitride films.

However, the aforementioned approaches can only provide tensile or compressive stresses ranging from about 200 MPa to about 500 MPa, which significantly limit the performance of the resulting MOSFET devices.

Therefore, there is a continuing need for structures and methods that can provide higher stresses to MOSFETs, so as to improve the performance of such MOSFETs.

SUMMARY OF THE INVENTION

The present invention advantageously employs phase change materials (PCMs) to apply desired stresses to respective MOSFET components (i.e., compressive stress to p-MOSFET channel and tensile stress to n-MOSFET channel).

The term "phase change materials" (PCMs) or "phase change material" (PCM) as used herein refers to material(s) that can switch reversibly between a first phase and a second, different phase, such as between an amorphous phase and a crystalline phase, between a polycrystalline phase and a monocrystalline phase, and/or between a first and second mono-crystalline phases of different crystal structures. The phase change in the PCM(s) may be achieved by various mechanisms, including but not limited to: heating at different temperatures, applying different voltages or electrical currents, etc. The phase change typically leads to volumetric expansion or contraction of the PCM(s), which can, in turn, results in intrinsic stresses (either compressive or tensile stresses) in the PCM(s) if the surrounding environment limits the expansion or contraction.

In one aspect, the present invention relates to a semiconductor device comprising at least one field effect transistor (FET) containing a source region, a drain region, a channel region, a gate dielectric layer, a gate electrode, and a phase change material layer adjacent to the channel region, wherein the phase change material layer contains intrinsic stress and is arranged and constructed to apply stress to the channel region of the FET.

In a preferred embodiment of the present invention, the intrinsically stressed phase change material layer is deposited over the channel region of the FET.

More preferably, and when the FET is an n-channel FET, the intrinsically stressed phase change material layer contains intrinsic compressive stress. Alternatively, and when the FET is a p-channel FET, the intrinsically stressed phase change material layer contains intrinsic tensile stress. Such intrinsically stressed phase change material layer may comprise compressively or tensilely stressed $Ge_2Sb_2Te_5$.

In another aspect, the present invention relates to a method for fabricating a semiconductor device, comprising:

providing a field effect transistor (FET) that comprises at least a source region, a drain region, a channel region, a gate dielectric layer, a gate electrode, and a phase change material layer; and treating the phase change material layer to induce phase change therein and to form an intrinsically stressed phase change material layer that is arranged and constructed to create stress in the channel region of the FET.

For an n-channel FET, the phase change material layer is preferably characterized by a polycrystalline phase that can be converted through phase change into a compressively stressed amorphous phase. For a p-channel FET, the phase change material layer is preferably characterized by an amorphous phase that can be converted through phase change into a tensilely stressed polycrystalline phase.

Preferably, the phase change material layer comprises $Ge_2Sb_2Te_5$, which can be reversibly switched between an amorphous phase and a polycrystalline phase.

In a further aspect, the present invention relates to a field effect transistor (FET) comprising an intrinsically stressed phase change material layer.

In a still further aspect, the present invention relates to a method comprising:

providing a field effect transistor (FET) that comprises a phase change material layer; and treating the phase change material layer to induce phase change therein and to form an intrinsically stressed phase change material layer in the FET.

Other aspects, features and advantages of the invention will be more fully apparent from the ensuing disclosure and appended claims.

DETAILED DESCRIPTION OF THE INVENTION AND PREFERRED EMBODIMENTS THEREOF

Figure 1:
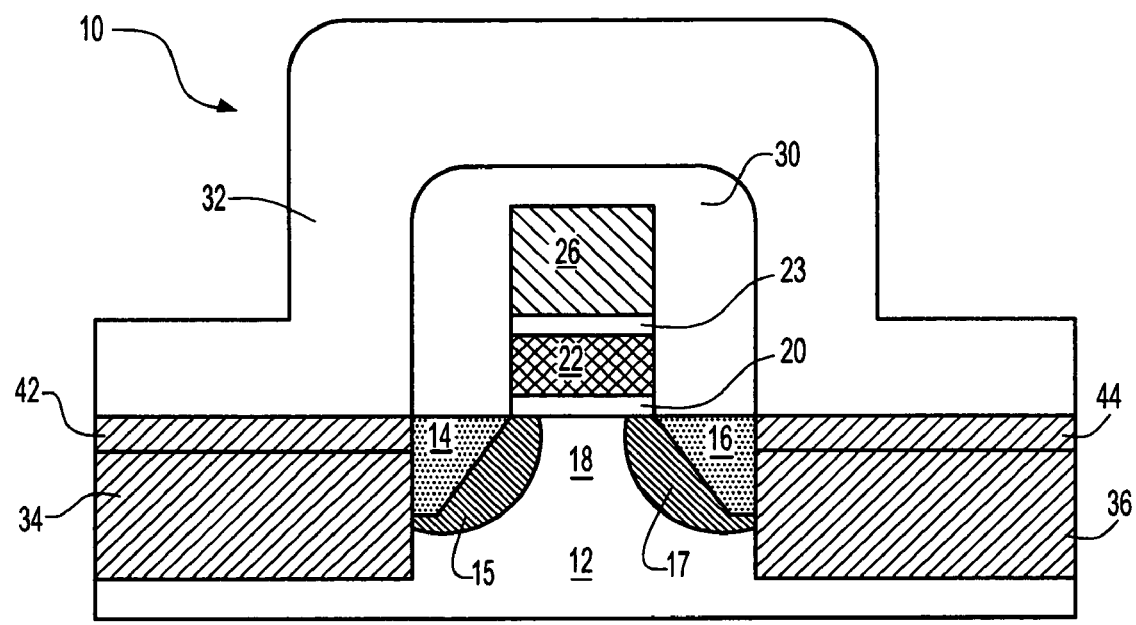
FIG. 1 shows an exemplary FET containing an intrinsically stressed phase change material layer, according to one embodiment of the present invention.

As mentioned hereinabove, the present invention uses an intrinsically stressed phase change material layer to create desired stress in the channel region of an FET (i.e., tensile stress in an n-channel and compressive stress in a p-channel). The intrinsically stressed phase change material layer is preferably formed from an unstressed phase change material layer via phase change treatment, which results in volumetric expansion or contraction that, in turn, leads to intrinsic compressive or tensile stress in the phase change material layer.

Phase change materials are well known in the art. For example, chalcogenide materials, such as $Ge_2Sb_2Te_5$ (GST), $In_2Se_3$ (IS), $Sb_2Te$ (ST), etc., and other phase change materials comprising groups IV to VI elements have been found reversibly switchable between an amorphous phase and a crystalline phase when heated to different temperatures or when different electrical pulses are applied. Specifically, when heated by an applied electrical pulse to above its glass-transition temperature, but below its melting temperature, increased mobility of the atoms in an amorphous chalcogenide material allows the atoms to rearrange into a crystalline phase that is more energetically favorable than the amorphous phase. The crystallized chalcogenide material can be changed back to its amorphous phase by applying an electrical pulse of greater magnitude, which heats the crystallized chalcogenide material to above its melting temperature, causing it to liquefy, and then rapidly cooling it by contacting with the surroundings to quench the chalcogenide material in the amorphous phase. For more details relating to the chalcogenide-based phase change materials, see Matthias Wuttig, "Towards A Universal Memory," NATURE MATERIALS, Vol. 4, pp. 265-266 (Apr. 2005); Van Pieterson et al., "Phase-Change Recording Materials with a Growth Dominated Crystallization Mechanisms: A Materials Overview," JOURNAL OF APPLIED PHYSICS, Vol. 97, 083520 (2005); and Heon Lee at al., "Indium Selenide ($In_2Se_3$) Thin Film for Phase-Change Memory," MATERIALS SCIENCE AND ENGINEERING B, Vol. 119, pp. 196-201 (2005).

The electric resistance of the chalcogenide material differs significantly between its amorphous and polycrystalline phases. Therefore, chalcogenide-based phase change materials have been widely used to form resistors for phase-change random access memory (PRAM) devices. Specifically, a chalcogenide-based phase change material layer is completely encapsulated by a top metal electrode layer, a bottom metal electrode layer, and lateral silicon dioxide layers, and is set to either an amorphous phase by a high voltage, short duration electric pulse or a polycrystalline phase by a low voltage, long duration electric pulse. By sensing the electrical resistance of the chalcogenide-based phase change material layer, the phase of such layer can be readily determined. See Heon Lee et al., "Indium Selenide ($In_2Se_3$) Thin Film for Phase-Change Memory," MATERIALS SCIENCE AND ENGINEERING B, Vol. 119, pp. 196-201 (2005).

The inventors of the present invention have discovered that besides resistance changes, phase change materials also experience significant volumetric expansion or contraction during phase changes, and that the phase change materials can also be used as stress-inducing means to create desired stress in the channel regions of FET devices. The usage of the phase change materials, as stress-inducing means in FET devices, is fundamentally different from the conventional usage of phase change materials as resistor elements in random access memory (PRAM) devices.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention provides a semiconductor device that comprises at least one MOSFET with an intrinsically stressed phase change material layer that is arranged and constructed to create desired stress in the channel region of the MOSFET, so as to enhance mobility of the corresponding carriers in the MOSFET channel region (i.e., electrons in the n-channel and holes in the p-channel).

The MOSFET device structure of the present invention, as well as the method for fabricating the same, will now be described in greater detail by referring to the accompanying drawings in FIGS. 1-9. Note that in these drawings, which are not drawn to scale, like and/or corresponding elements are referred to by like reference numerals. It is further noted that in the drawings only one MOSFET is shown atop a single semiconductor substrate. Although illustration is made to such an embodiment, the present invention is not limited to the formation of any specific number of MOSFET devices on the surface of the semiconductor structure.

Reference is first made to FIG. 1, which shows an MOSFET 10, according to one embodiment of the present invention, which can be either an n-channel MOSFET or a p-channel MOSFET.

The MOSFET 10 is formed in a semiconductor substrate 12 and comprises: (1) a source region that contains source pocket or "halo" implant 15, source extension implant 14, source implant 34, and source contact 42; (2) a drain region that contains drain pocket or "halo" implant 17, drain extension implant 16, drain implant 36, and drain contact 44; (3) a channel region 18 between the source region and the drain region; (4) a gate stack that overlays the channel region 18 and contains a gate dielectric layer 20, a gate electrode 22, an insulating layer 23 (which is optional), and an intrinsically stressed phase change material layer 26. The MOSFET 10 may further comprise optional spacers 30 around the gate stack and an insulating cap layer 32 overlaying the entire structure.

When the MOSFET 10 is an n-channel FET, the phase change material layer 26 preferably contains intrinsic compressive stress, so that tensile stress is created in the channel region 18 along the source-drain direction while compressive stress is created along the direction (normal to the gate dielectric) that is perpendicular to the source-drain direction, which enhances mobility of electrons along the source-drain direction. On the other hand, when the MOSFET 10 is a p-channel FET, the phase change material layer 26 preferably contains intrinsic tensile stress, so that compressive stress is created in the channel region 18 along the source-drain direction while tensile stress is created along the direction (normal to the gate dielectric) that is perpendicular to the source-drain direction, which enhances mobility of holes along the source-drain direction.

Figure 2:
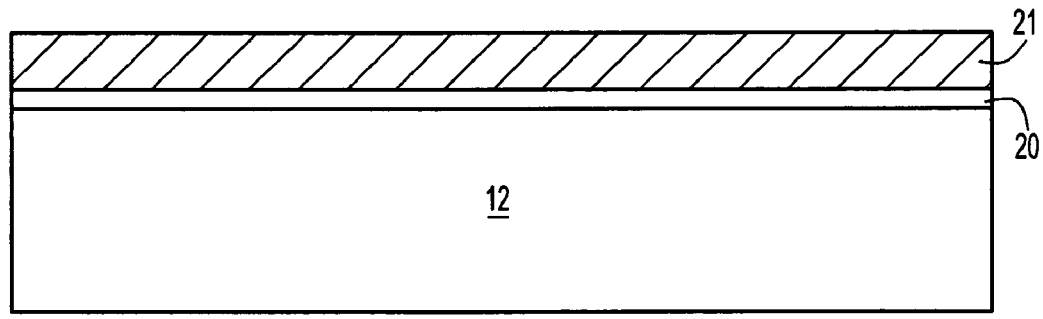
FIGS. 2-9 illustrate the processing steps for forming the exemplary FET in FIG. 1.

FIGS. 2-9 show the processing steps for forming the MOSFET structure of FIG. 1. First, a gate dielectric layer 20 and a gate conductor layer 21 are deposited over the semiconductor substrate 12, as shown in FIG. 2.

The semiconductor substrate 12 may comprise any semiconductor material including, but not limited to: Si, SiC, SiGe, SiGeC, Ge alloys, GaAs, InAs, InP, as well as other III-V or II-VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein. The semiconductor substrate 12 may include a first doped (n- or p-) device region (not shown) for an n-MOSFET (not shown), and/or a second doped (n- or p-) device region (not shown) for a p-MOSFET (not shown). The first and/or second doped device regions, typically known as "wells," may have the same or different conductivities and/or doping concentrations.

At least one isolation region (not shown) is typically formed into the semiconductor substrate 12, to provide isolation for the doped devise regions or "wells". The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

After forming the at least one isolation region (not shown) within the semiconductor substrate 12, a gate dielectric layer 20 is deposited on the entire surface of the substrate 12. The gate dielectric layer 20 can be formed by a thermal growing process such as, for example, oxidation, nitridation or oxynitridation. Alternatively, the gate dielectric layer 20 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layer 20 may also be formed utilizing any combination of the above processes.

The gate dielectric layer 20 is comprised of an insulating material including, but not limited to: an oxide, nitride, oxynitride and/or silicate including metal silicates and nitrided metal silicates. In one embodiment, it is preferred that the gate dielectric layer 20 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. More preferably, the gate dielectric layer 20 comprises $SiO_2$ or $HfO_2$. The physical thickness of the gate dielectric layer 20 may vary, but typically, the gate dielectric layer 20 has a thickness from about 0.5 to about 10 nm, with a thickness from about 0.5 to about 3 nm being more typical.

Next, a gate conductor layer 21 is formed on the gate dielectric layer 20, which may comprise polysilicon, poly-SiGe, a metal, or any other suitable conducting material. The metal used in forming the gate conductor layer 21 comprises any metal or metal alloy that is suitable for forming the gate electrode, either in its metallic form or in its nitride form. Examples of such metals or metal alloys include, but are not limited to: Ta, W, Co, Ni, Pt, Pd, Ti, and alloys thereof. In one embodiment where the MOSFET 10 is an n-channel MOSFET, Ta is a preferred gate metal. In another embodiment where the MOSFET 10 is a p-channel MOSFET, W is preferred as the gate metal. The gate conductor layer 21 may be deposited using any conventional deposition process including, for example, sputtering, chemical vapor deposition, evaporation, chemical solution deposition, plating and the like. The thickness, i.e., height, of the gate conductor layer 21 may vary depending on the deposition process employed. Typically, the gate conductor layer 21 has a thickness ranging from about 0.1 to about 10 nm, with a thickness from about 1-5 nm or 2-3 nm being more typical.

Figure 3:
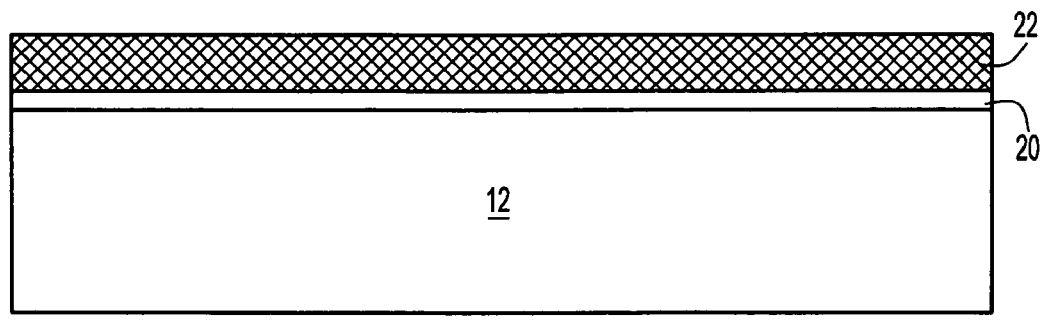

Preferably, but not necessarily, the gate conductor layer 21 comprises a metal or metal alloy and is annealed at an elevated temperature in a nitrogen-containing environment, to form a metal nitride gate electrode 22, as shown in FIG. 3. The metal nitride gate electrode 22 is characterized by enhanced thermal stability in comparison with a pure metal gate electrode. The metal nitride gate electrode 22 preferably comprises $TaNi_x$ for an n-channel MOSFET, and $WN_x$ for a p-channel MOSFET. It is emphasized that metal nitride gate electrode 22 can be replaced with other gate electrode materials. As such, and in the following description, reference numeral 22 can be used in defining these other gate electrode materials as well.

Figure 4:
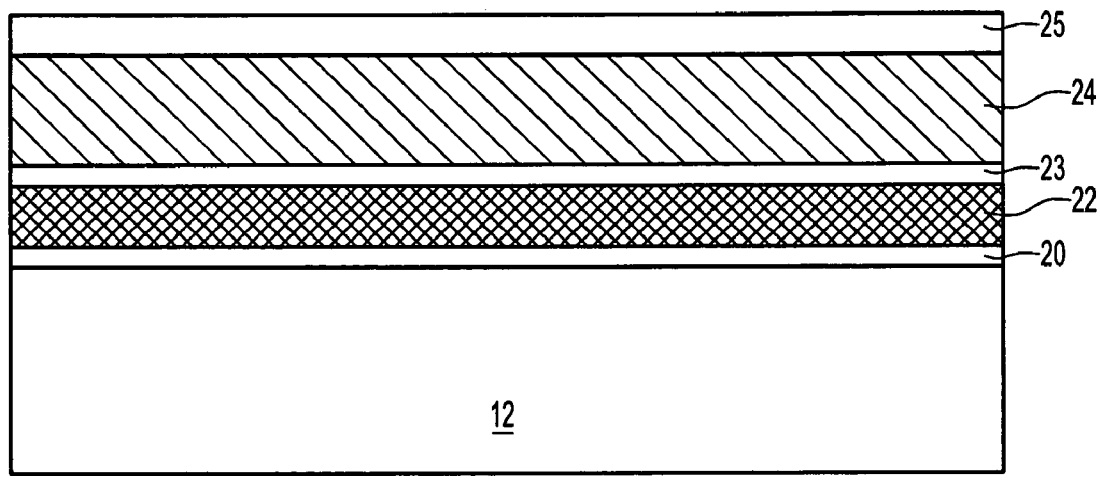

FIG. 4 shows sequential deposition of a first insulating layer 23, a phase change material layer 24, and a second insulating layer 25 over the metal nitride gate electrode 22. If necessary, ion implantation can be conducted (e.g., nitrogen implant) to dope the phase change material layer 24 in order to adjust the glass transition temperature and/or melting temperature of the phase change material.

The first and second insulating layers 23 and 25 may comprise any suitable insulating material including, but not limited to: an oxide, nitride, oxynitride and/or silicate including a metal silicate and a nitrided metal silicate. In one embodiment, it is preferred that the insulating layers 23 and 25 comprise a nitride or an oxynitride insulating material, such as silicon nitride or silicon oxynitride. Preferably, but not necessarily, the first insulating layer 23 has a thickness from about 1 to about 50 nm, more preferably from about 5 to about 10 nm, and the second insulating layer 25 has a thickness from about 10 to about 100 nm, more preferably from about 20 to about 40 nm.

The phase change material layer 24 is preferably characterized by a thickness ranging from about 10 to about 500 nm, more preferably from about 50 to about 100 nm, and it may comprise any suitable material that switches reversibly between a first phase and a second, different phase, as long as the phase change of such a material leads to volumetric expansion or contraction. For example, the phase change material layer 24 may comprise one or more chalcogenide materials as mentioned hereinabove, which reversible switch between a relatively compact, polycrystalline phase and an expanded, amorphous phase. Phase change in such chalcogenide materials therefore usually results in volumetric expansion or contraction, which, in turn, creates intrinsic stresses (either compressive or tensile stresses) in the chalcogenide materials if the expansion or contraction is limited by the surrounding environment. In a preferred embodiment of the present invention, the phase change material layer 24 comprises $Ge_2Sb_2Te_5$ (GST). In other embodiments, the phase change material layer 24 comprises $In_2Se_3$ (IS), $Sb_2Te$ (ST), or any other phase change material comprising groups IV to VI elements.

As mentioned hereinabove, when the MOSFET 10 is an n-channel FET, the phase change material layer 26 preferably contains intrinsic compressive stress. In order to form the compressively stressed phase change material layer 26, it is preferred that the phase change material layer 24 contains polycrystalline GST, which can be subsequently converted into amorphous GST via phase change. Because amorphous GST is relatively more expanded in volume than polycrystalline GST, intrinsic compressive stress can be created by limiting the volumetric expansion of the amorphous GST.

On the other hand, when the MOSFET 10 is a p-channel FET, the phase change material layer 26 preferably contains intrinsic tensile stress. For forming such a tensilely stressed phase change material layer 26, it is preferred that the phase change material layer 24 contains amorphous GST, which can be subsequently converted into polycrystalline GST via phase change. Since polycrystalline GST is relatively more compact in volume than amorphous GST, intrinsic tensile stress can be created by limiting the volumetric contraction of the polycrystalline GST.

Figure 5:
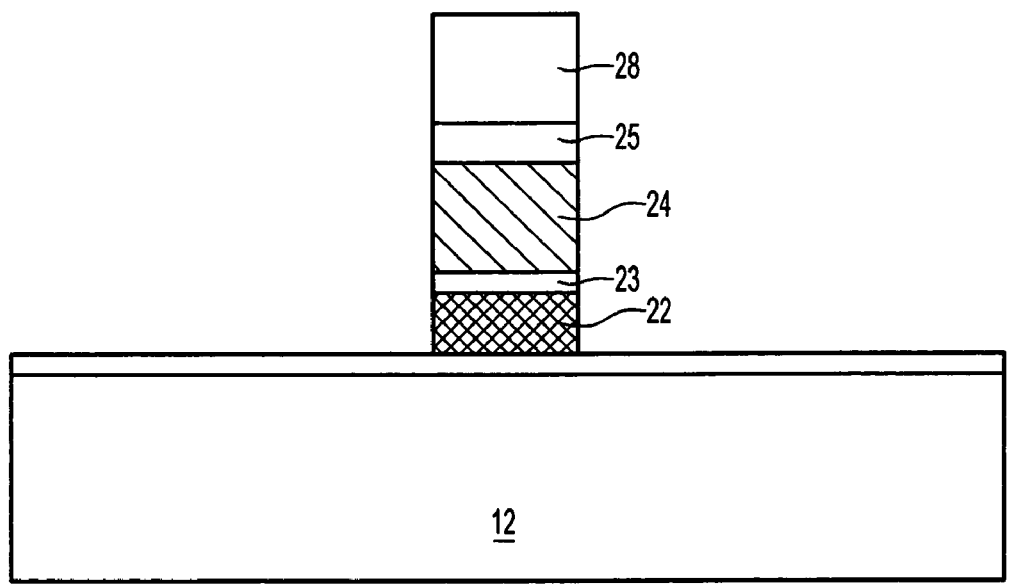

The layers 20, 22, 23, 24, and 25 jointly form a gate stack layer, which may comprise any additional structure layers commonly included in MOS gate structures. The gate stack layer is then patterned by lithography and etching to expose an upper surface of the gate dielectric layer 20 and to form at least one patterned gate stack as shown in FIG. 5. The lithography step includes applying a photoresist 28 to the upper surface of the second insulating layer 25, exposing the photoresist 28 to a desired pattern of radiation and developing the exposed photoresist 28 utilizing a conventional resist developer. The pattern in the photoresist 28 is then transferred to the gate stack layer utilizing one or more dry etching steps, forming the patterned gate stack in FIG. 5. Suitable dry etching processes that can be used in the present invention in forming the patterned gate stack include, but are not limited to: reactive ion etching (RIE), ion beam etching, plasma etching or laser ablation. The patterned photoresist 28 is then removed, and optionally the gate dielectric layer 20 is etched by an RIE step to expose an upper surface of the semiconductor substrate 12.

Figure 6:
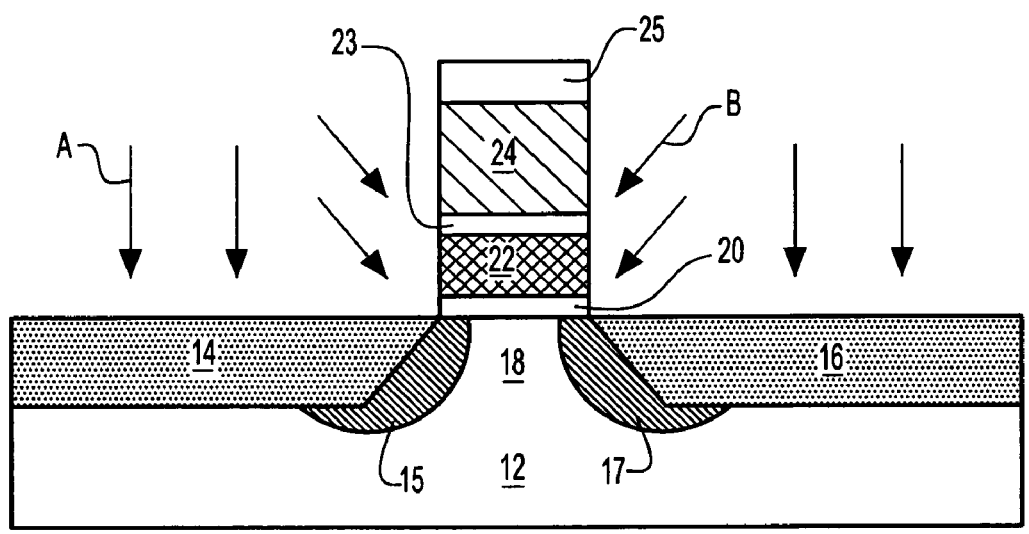

Subsequently, ion implantation A can be performed using the patterned gate stack as an implant mask to form extension implants 14 and 16 in a self-aligned manner, as shown in FIG. 6. The extension implants 14 and 16 are impurity layers that contain n-type dopant species, such as arsenic and phosphorous, for p-channel MOSFET or p-type dopant species, such as boron and indium for n-channel MOSFET. The dopant species are formed to produce shallower junctions than the main source/drain layers to be formed later. The extension implants 14 and 16 are of the same conductivity type as the main source/drain layers (to be formed subsequently) and function as source/drain layers; thus, they are referred to herein as source/drain extension implants. The source/drain extension implants 14 and 16 may extend more than necessary under the patterned gate stack, due to scattering of impurity ions during implantation and diffusion of impurity ions in a subsequent process.

Thereafter, a halo implantation B can be carried out to form pocket or halo implants 15 and 17 using the patterned gate stack as a mask. Preferably, but not necessarily, the halo implantation B is conducted at a predetermined inclined angle relative to the vertical direction, as shown in FIG. 6. The inclined angle preferably ranges from 5° to 45° with respect to the vertical direction to the substrate surface. In one embodiment, angled halo implantation B is applied first from a first angle to form one of the halo implants 15 and 17, and then from a second angle to form the other of the halo implants 15 and 17. The angled implantation B may be accomplished with an ion implanter, which may include an ion beam generator for generating an ion beam. The direction of the ion beam with respect to the wafer substrate can be adjusted either by maintaining the wafer substrate at a certain angle or by adjusting the angle of the ion beam. The implant species, energy level of the ion beam, and/or the duration of the ion beam exposure may be adjusted to achieve optimal implant level.

Figure 7:
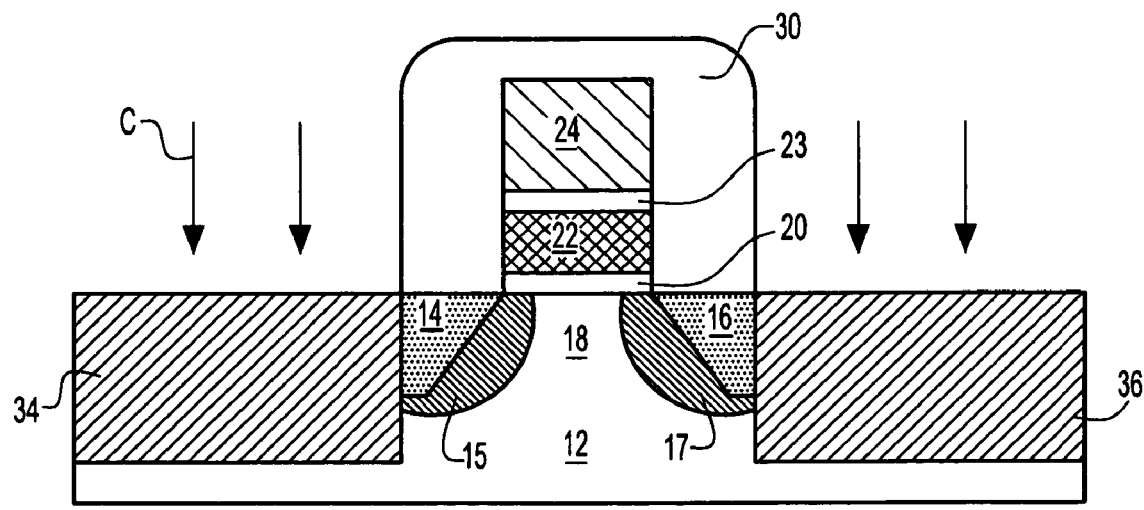

FIG. 7 shows subsequent formation of source/drain spacer layer 30 over the patterned gate stack by conventionally known processing steps, such as CVD and RIE. The source/drain spacer layer 30 can comprise any insulating material, such as silicon nitride, silicon dioxide, or silicon oxynitride. Preferably, such source/drain spacer layer 30 are formed of silicon nitride.

Another ion implantation C can then be performed using the patterned gate stack and the source/drain spacer 30 as implant masks to form source and drain implants 34 and 36 in a self-aligned manner, as shown in FIG. 7. The presence of source/drain spacer 30 effectively prevents formation of overlapping portions between the gate electrode 22 and the source/drain implants 34 and 36. The source/drain implants 34 and 36 can be subsequently annealed to activate the dopant species implanted therein. The conditions for the ion implantation and the annealing step are well known to those skilled in the art.

Figure 8:
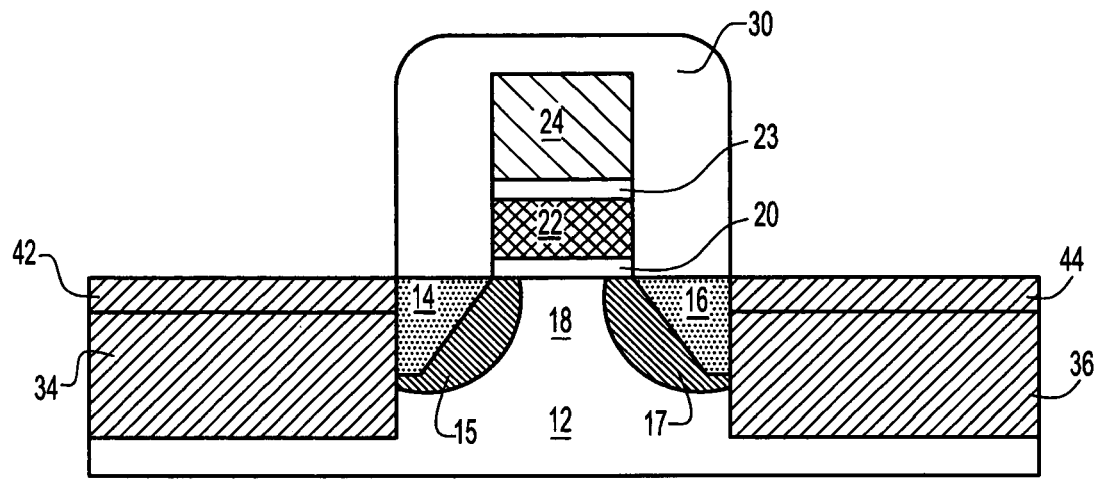

FIG. 8 shows the step for forming metal silicide contacts 42 and 44 over the source/drain implants 34 and 36 by a salicidation process. In accordance with one embodiment of the present invention, a thin metal layer (e.g., about 3-15 nm thick) is formed over the entire structure, followed by an annealing step carried out at an elevated annealing temperature ranging from about 350° C. to about 450° C. for about 5-50 seconds, where the metal reacts with exposed silicon in the source/drain implants 34 and 36 to form a metal silicide. Unreacted metal in other regions can then be removed by a wet etching step.

The metal used in forming the metal silicide contacts 42 and 44 may comprise any metal or metal alloy that is capable of reacting with silicon to form a metal silicide. Examples of such metals or metal alloys include, but are not limited to: Ti, Ta, W, Co, Ni, Pt, Pd and alloys thereof. In one embodiment, Ni is a preferred metal. The metal layer may be deposited using any conventional deposition process including, for example, sputtering, chemical vapor deposition, evaporation, chemical solution deposition, plating and the like. If the semiconductor substrate 12 does not comprise silicon, silicon layers (not shown) can be grown over the source and drain regions of the MOSFET before deposition of the metal layer for subsequent formation of source/drain metal silicide contacts 42 and 44.

Figure 9:
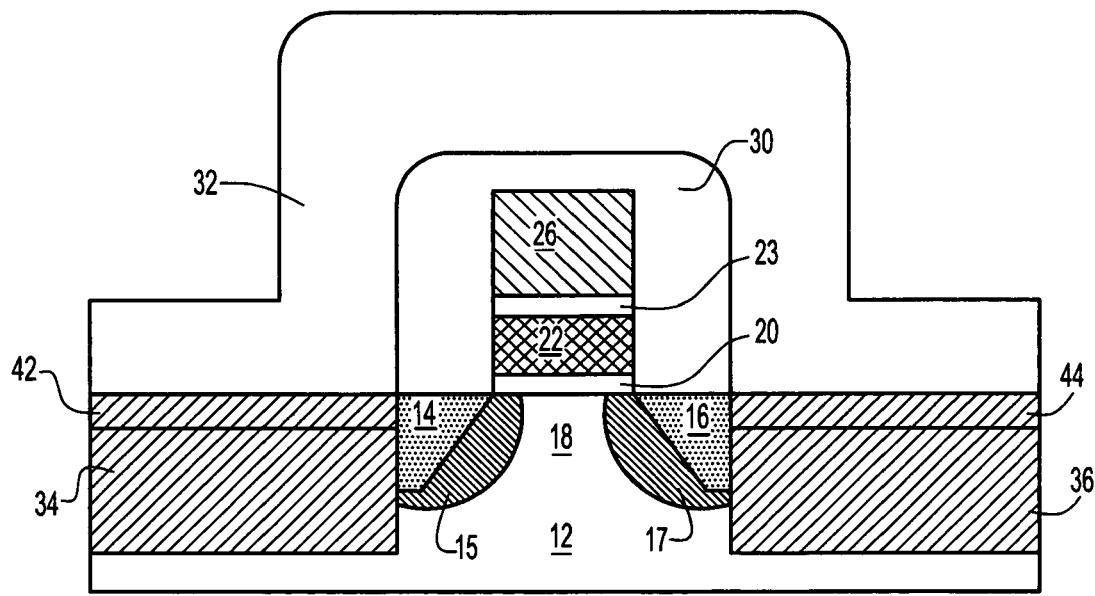

FIG. 9 shows the step for forming an insulating capping layer 32 over the entire structure of FIG. 8. The insulating capping layer 32 may comprise any suitable insulating material including, but not limited to: an oxide, nitride, oxynitride and/or silicate including a metal silicate and a nitrided metal silicate. It is preferred that the insulating capping layer 32 comprises a nitride or an oxynitride insulating material, such as silicon nitride or silicon oxynitride. Such an insulating capping layer 32 can be formed by various dielectric deposition techniques, such as, for example, low pressure chemical vapor deposition (LPCVD), plasma-enhanced chemical vapor deposition (PECVD), or high-density plasma chemical vapor deposition (HDP CVD), or any other process commonly used for dielectric deposition.

Subsequently, a thermal annealing step is carried out at an elevated temperature to effectuate phase change of the phase change material layer 24 and to form an intrinsically stressed phase change material layer 26, as shown in FIG. 9.

As mentioned hereinabove, when the MOSFET 10 is an n-channel MOSFET, the intrinsically stressed phase change material layer 26 contains intrinsic compressive stress. Alternatively, when the MOSFET 10 is a p-channel MOSFET, the intrinsically stressed phase change material layer 26 contains intrinsic tensile stress.

Specifically, for an n-channel MOSFET, the phase change material layer 24 preferably contains polycrystalline GST, which can be converted into amorphous GST by laser annealing step at an elevated temperature ranging from about 500° C. to about 700° C., and the cooling down time is less than 50 nanoseconds. The annealing temperature is above the melting temperature of GST material, and it therefore liquefies the polycrystalline GST. Since the annealing is conducted for a very short duration, the melted GST is rapidly cooled down due to contact with the surrounding structures and is therefore quenched in an amorphous phase. The amorphous GST undergoes volumetric expansion (about 2-3% of total volume of the polycrystalline GST), which, when confined by the spacer 30 and the insulating capping layer 32, functions to generate intrinsic compressive stress. The compressively stressed amorphous GST layer, in turn, causes the underlying channel region 18 to be tensilely stressed along the source-drain direction, i.e., the x direction, and compressively stressed along a "y" direction that is perpendicular to the source-drain direction or normal of the gate dielectric surface.

On the other hand, for a p-channel FET, the phase change material layer 24 preferably contains amorphous GST, which can be converted into polycrystalline GST by an annealing step conducted at a relatively low annealing temperature (e.g., from about 300° C. to about 500° C.), which is above the glass transition temperature (Tg), but below the melting temperature (Tm) of GST, and for a relatively extended duration (e.g., longer than 100 nanoseconds). The extended annealing at above Tg increases mobility of the atoms in the amorphous GST and allows the atoms to rearrange into a polycrystalline phase that is more energetically favorable than the amorphous phase. The polycrystalline GST undergoes volumetric contraction, which is confined by the spacer 30 and the insulating capping layer 32 and therefore generates intrinsic tensile stress. The tensilely stressed polycrystalline GST layer, in turn, causes the underlying channel region 18 to be compressively stressed along the x direction and tensilely stressed along the y direction.

The phase change material layer 24 may comprise any other suitable phase change materials well known in the art. Moreover, other well-known phase changing techniques besides thermal annealing can be used to effectuate the desired phase change.

It should be noted that although the above-described processing steps illustrate a phase change material layer that is deposited over the channel region of the MOSFET, the present invention is not limited to such a specific configuration, and the phase change material layer can be provided beneath or at a side of the channel region, for creating desired stress in the channel region. For example, when the phase change material layer is provided at a side of the channel region, intrinsic compressive stress in the phase change material layer will also create compressive stress along the x direction, while intrinsic tensile stress in such PCT layer will create tensile stress along the x direction.

Further, although the above-described FET structures do not include raised source/drain regions, the present invention also contemplates the presence of raised source/drain regions in the FET structures. The raised source/drain regions are formed utilizing conventional techniques well known to those skilled in the art. Specifically, the raised source/drain regions are formed by depositing any Si-containing layer, such as epitaxial Si, amorphous Si, SiGe, and the like, atop the semiconductor substrate 10 prior to implanting.

The methods of the present invention can be widely used for fabricating various semiconductor device structures including, but not limited to: complementary metal-oxide-semiconductor (CMOS) transistors, as well as integrated circuit, microprocessors and other electronic devices comprising such CMOS transistors, which are well known to those skilled in the art and can be readily modified to incorporate the strained semiconductor-on-insulator structure of the present invention, and therefore details concerning their fabrication are not provided herein.

The phase change material described above can be used in conjugation with other well-known materials that can cause enhanced mobility in the channel region of the MOSFET device. For example, the phase change material can be used with a stressed liner that is formed about the gate stack, or it can be used with an embedded well region and/or embedded and stressed source/drain regions.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising at least one p-channel field effect transistor (FET) containing a source region, a drain region, a channel region, a gate dielectric layer, a gate electrode, and an intrinsically stressed phase change material layer comprised of $Ge_2Sb_2Te_5$, $In_2Se_3$, $Sb_2Te$ or a combination thereof, the intrinsically stressed phase change material layer overlying the gate electrode and arranged and constructed for creating stress in the channel region of the at least one p-channel FET, wherein said intrinsically stressed phase change material layer contains intrinsic tensile stress, and wherein an insulating cap layer is positioned overlying the gate electrode, the intrinsically stressed phase change material, and the gate dielectric layer to confine a volumetric expansion or contraction of the intrinsically stressed phase change material layer in producing the stress in the channel region, wherein the volumetric expansion or contraction of the intrinsically stressed phase change material results from a phase change between a crystalline state and an amorphous state.

2. The semiconductor device of claim 1, wherein the intrinsically stressed phase change material layer is doped.

3. The semiconductor device of claim 1, wherein the intrinsically stressed phase change material layer is located over the channel region of said FET.

4. The semiconductor device of claim 1, further comprising at least one n-channel FET, said at least one n-channel FET including an intrinsically stressed phase change material layer of intrinsic compressive stress.

5. The semiconductor device of claim 4, wherein the intrinsically stressed phase change material layer comprises compressively stressed amorphous $Ge_2Sb_2Te_5$ or compressively stressed amorphous nitrogen doped $Ge_2Sb_2Te_5$.

6. The semiconductor device of claim 1, wherein the intrinsically stressed phase change material layer contains tensilely stressed polycrystalline $Ge_2Sb_2Te_5$ or tensilely stressed polycrystalline nitrogen doped $Ge_2Sb_2Te_5$.

7. A semiconductor device comprising at least one p-channel field effect transistor (FET) containing a source region, a drain region, a channel region, a gate dielectric layer, a gate electrode, and an intrinsically stressed phase change material layer, the intrinsically stressed phase change material layer overlying the gate electrode and arranged and constructed for creating stress in the channel region of the at least one p-channel FET, wherein said intrinsically stressed phase change material layer contains intrinsic tensile stress, and wherein an insulating cap layer is positioned overlying the gate electrode, the intrinsically stressed phase change material, the gate dielectric layer, and source and drain spacers abutting the intrinsically stressed phase change material to confine a volumetric expansion or contraction of the intrinsically stressed phase change material layer in producing the stress in the channel region, wherein the volumetric expansion or contraction of the intrinsically stressed phase change material results from a phase change between a crystalline state and an amorphous state.

8. A semiconductor device comprising at least one p-channel field effect transistor (FET) containing a source region, a drain region, a channel region, a first dielectric layer overlying the channel region, a gate electrode overlying the first dielectric, a second dielectric layer overlying the gate electrode and an intrinsically stressed phase change material layer present on the second dielectric layer and overlying the gate electrode and arranged for creating stress in the channel region of the at least one p-channel FET, wherein said intrinsically stressed phase change material layer contains intrinsic tensile stress, and wherein an insulating cap layer is positioned overlying the intrinsically stressed phase change material, the second dielectric layer, the gate electrode and the first dielectric layer to confine a volumetric expansion or contraction of the intrinsically stressed phase change material layer in producing the stress in the channel region.

* * * * *